United States Patent
Hasegawa et al.

(10) Patent No.: US 8,233,257 B2
(45) Date of Patent: Jul. 31, 2012

(54) POWER SUPPLY CIRCUIT, OVERCURRENT PROTECTION CIRCUIT FOR THE SAME, AND ELECTRONIC DEVICE

(75) Inventors: Morihito Hasegawa, Kasugai (JP); Hidenobu Ito, Kasugai (JP); Kwok Fai Hui, Hong Kong (CN); Toshihiko Kasai, Kasugai (JP); Katsuyuki Yasukouchi, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 797 days.

(21) Appl. No.: 12/369,907

(22) Filed: Feb. 12, 2009

(65) Prior Publication Data

US 2009/0201618 A1 Aug. 13, 2009

(30) Foreign Application Priority Data

Feb. 13, 2008 (JP) ................................ 2008-031330

(51) Int. Cl.
H02H 9/08 (2006.01)
(52) U.S. Cl. ...................................... 361/93.9
(58) Field of Classification Search .................. 361/93.9
See application file for complete search history.

(56) References Cited

U.S. PATENT DOCUMENTS

| | | | | |
|---|---|---|---|---|
| 6,801,419 B2 * | 10/2004 | Fukui | ............................ | 361/93.1 |
| 6,922,321 B2 * | 7/2005 | Katoh et al. | ................. | 361/93.9 |
| 6,977,491 B1 * | 12/2005 | Caldwell et al. | .............. | 323/282 |
| 7,233,462 B2 * | 6/2007 | Kanakubo | ...................... | 361/18 |
| 7,944,663 B2 * | 5/2011 | Morino | ........................ | 361/93.1 |
| 7,974,060 B2 * | 7/2011 | Morino | ........................ | 361/93.9 |
| 2003/0128489 A1 | 7/2003 | Katoh et al. | | |
| 2004/0004466 A1 | 1/2004 | Miyanaga et al. | | |
| 2005/0083027 A1 * | 4/2005 | Kikuchi | ........................ | 323/287 |
| 2005/0151522 A1 * | 7/2005 | Haraguchi et al. | ............ | 323/276 |
| 2006/0012932 A1 | 1/2006 | Kitagawa | | |
| 2006/0103992 A1 | 5/2006 | Kanakubo | | |
| 2007/0114982 A1 * | 5/2007 | Itoh et al. | ...................... | 323/277 |
| 2007/0216381 A1 | 9/2007 | Tsuchiya et al. | | |
| 2008/0285198 A1 * | 11/2008 | Morino | ........................ | 361/93.9 |
| 2009/0189584 A1 * | 7/2009 | Suzuki | .......................... | 323/284 |
| 2010/0052636 A1 * | 3/2010 | Takagi et al. | ................. | 323/281 |
| 2011/0234260 A1 * | 9/2011 | Oyama | ........................... | 327/89 |

FOREIGN PATENT DOCUMENTS

| | | |
|---|---|---|
| JP | 2003-186554 A | 7/2003 |
| JP | 2004-38831 | 2/2004 |
| JP | 2006-53898 | 2/2006 |
| JP | 2006-139673 A | 6/2006 |
| JP | 2007-249712 | 9/2007 |

* cited by examiner

Primary Examiner — Ronald W Leja
(74) Attorney, Agent, or Firm — Fujitsu Patent Center

(57) ABSTRACT

A power supply circuit includes an output transistor including a source coupled to power supply voltage, and a drain from which output voltage is outputted; a first error amplifier powered by the power supply voltage and outputting a signal based on a potential difference between the output voltage and a reference voltage; a buffer transistor including a gate coupled to the output of the first error amplifier, and a source coupled via a constant current source to the power supply voltage and coupled to a gate of the output transistor; a current detection transistor coupled to the output transistor such that a gate and source are shared; and an overcurrent protection circuit configured to limit the drain current of the buffer transistor based on the increase of the drain current of the current detection transistor and thereby control the output current of the output transistor.

9 Claims, 6 Drawing Sheets

POWER SUPPLY CIRCUIT, OVERCURRENT PROTECTION CIRCUIT FOR THE SAME, AND ELECTRONIC DEVICE

CROSS-REFERENCE TO RELATED APPLICATIONS

This application is based upon and claims the benefit of priority of the prior Japanese Patent Application No. 2008-31330 filed on Feb. 13, 2008 the entire contents of which are incorporated herein by reference.

FIELD

The embodiments discussed herein are related to a power supply circuit, an overcurrent protection circuit for the same, and an electronic device.

BACKGROUND

FIG. 1 illustrates an example of a related art power supply circuit. An output transistor Tr1 composed of a P channel MOS transistor, having a source that is coupled to power supply voltage VDD, outputs voltage Vo from a drain thereof. Power supply voltage VDD is supplied to an error amplifier 1. Output voltage Vo is divided by resistors R1 and R2 and inputted to a plus-side input terminal of the error amplifier 1. Reference voltage Vref is inputted to a minus-side input terminal of the error amplifier 1. The output of the error amplifier 1 is inputted to a gate of a buffer transistor Tr2 composed of a P channel MOS transistor. A source of the buffer transistor Tr2 is coupled via a constant current source to power supply voltage VDD and at the same time to a gate of the output transistor Tr1. A drain of the buffer transistor Tr2 is coupled to a ground.

As illustrated in FIG. 1, the power supply circuit includes an overcurrent protection circuit. The overcurrent protection circuit is the part surrounded by the dashed line in FIG. 1. The overcurrent protection circuit is coupled to a drain of a current detection transistor Tr3 and a gate of the buffer transistor Tr2. The current detection transistor Tr3 composed of a P channel MOS transistor is coupled to the output transistor Tr1 such that a gate and source are shared. A resistor R11 is provided between the drain of the current detection transistor Tr3 and the ground. A gate of a transistor Tr11 composed of an N channel MOS transistor is provided between the drain of the current detection transistor Tr3 and the resistor R11. A drain of the transistor Tr11 is coupled via a resistor R12 to power supply voltage VDD and at the same time to a gate of a transistor Tr12 composed of a P channel MOS transistor. A source of the transistor Tr11 is coupled to the ground. A source of the transistor Tr12 is coupled to power supply voltage VDD. A drain of the transistor Tr12 is coupled to the gate of the buffer transistor Tr2.

The operation of the power supply circuit and overcurrent protection circuit for the same will be described. When a fall of output voltage Vo causes the input voltage of the plus-side input terminal of the error amplifier 1 to fall below reference voltage Vref of the minus-side input terminal, the error amplifier 1 decreases the gate voltage of the buffer transistor Tr2. Then, the on-resistance of the buffer transistor Tr2 decreases and the gate voltage of the output transistor Tr1 lowers. Thus, the on-resistance of the output transistor Tr1 decreases, so that output voltage Vo is raised. Meanwhile, when a rise in output voltage Vo causes the input voltage of the plus-side input terminal of the error amplifier 1 to exceed reference voltage Vref of the minus-side input terminal, the error amplifier 1 raises the gate voltage of the buffer transistor Tr2. Then, the on-resistance of the buffer transistor Tr2 increases and the gate voltage of the output transistor Tr1 rises. Thus, the on-resistance of the output transistor Tr1 increases, so that output voltage Vo is lowered. In this way, output voltage Vo is kept constant.

When the output current of the output transistor Tr1 increases, the drain current of the current detection transistor Tr3 sharing the gate and source with the output transistor Tr1 increases. When the drain current of the current detection transistor Tr3 increases, the gate voltage of the transistor Tr11 rises due to the resistor R11. Then, the on-resistance of the transistor Tr11 decreases and the gate voltage of the transistor Tr12 lowers. Thus, the on-resistance of the output transistor Tr12 decreases, so that the gate voltage of the buffer transistor Tr2 rises substantially to power supply voltage VDD and the buffer transistor Tr2 is turned off. Consequently, the gate voltage of the output transistor Tr1 rises and the on-resistance thereof increases, whereby the overcurrent protection works.

In addition to the above technique, various types of techniques for overcurrent protection circuit for a power supply circuit have been proposed, such as Japanese Patent Laid-Open Nos. 2003-186554 and 2006-139673.

However, the related art power supply circuit as illustrated in FIG. 1 has a relatively long feedback path. More specifically, output overcurrent is monitored by the current detection transistor Tr3, and the gate voltage of the buffer transistor Tr2 is controlled through the transistors Tr11 and Tr12, and then the gate voltage of the output transistor Tr1 is controlled, whereby the overcurrent protection works. The response of the overcurrent protection circuit is delayed due to such a relatively long feedback path. Further, circuit oscillation is apt to occur, imposing a problem on the stability of circuit operation. Japanese Patent Laid-Open Nos. 2003-186554 and 2006-139673 do not disclose any measure for shortening the feedback path.

SUMMARY

According to an aspect of the invention, a power supply circuit includes an output transistor including a source coupled to power supply voltage, and a drain from which output voltage is outputted; a first error amplifier powered by the power supply voltage and outputting a signal based on a potential difference between the output voltage and a reference voltage; a buffer transistor including a gate coupled to the output of the first error amplifier, and a source coupled via a constant current source to the power supply voltage and coupled to a gate of the output transistor; a current detection transistor coupled to the output transistor such that a gate and source are shared; and an overcurrent protection circuit configured to limit the drain current of the buffer transistor based on the increase of the drain current of the current detection transistor and thereby control the output current of the output transistor.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Figure 1:
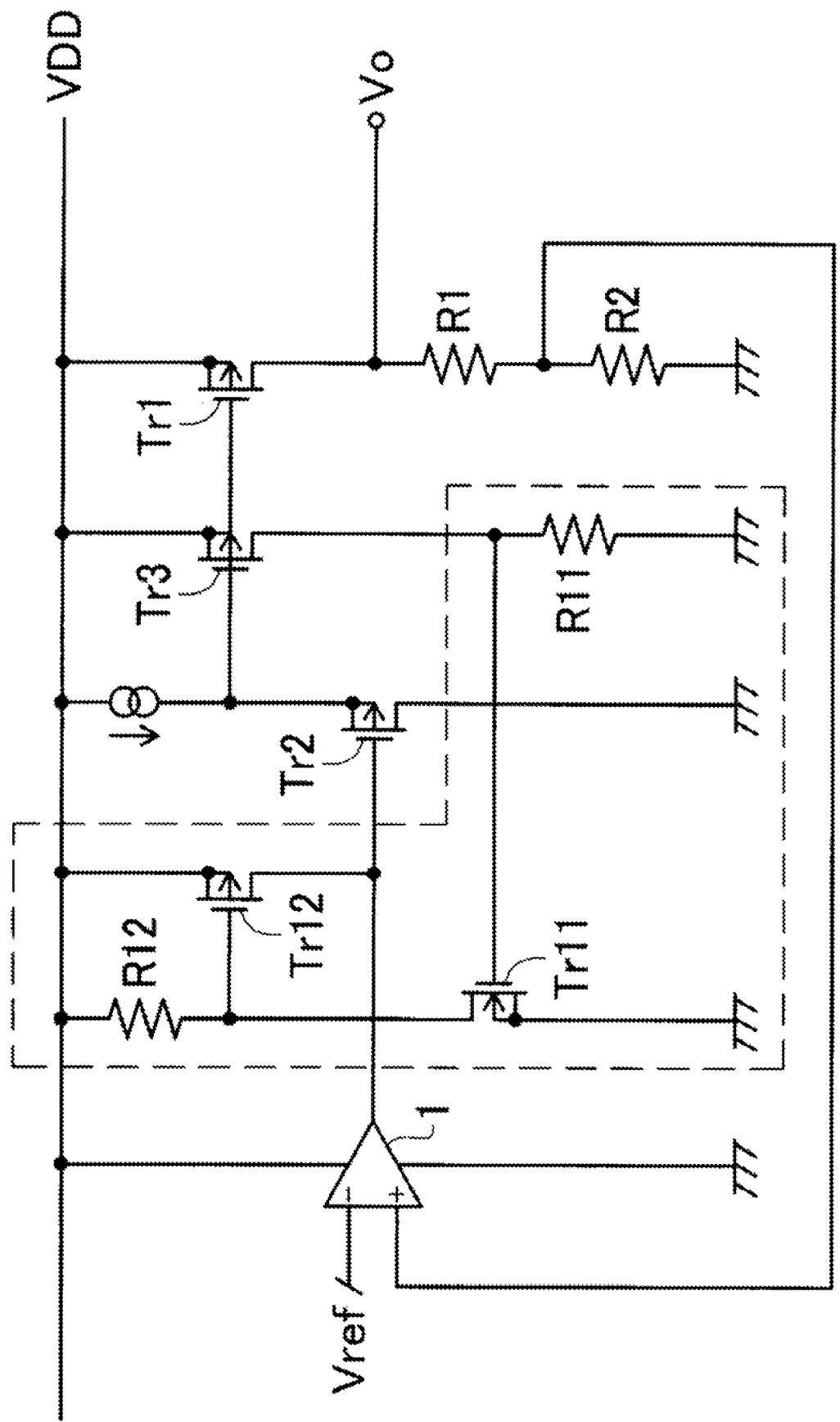
FIG. 1 illustrates a circuit diagram of a related art power supply circuit.
Figure 2:
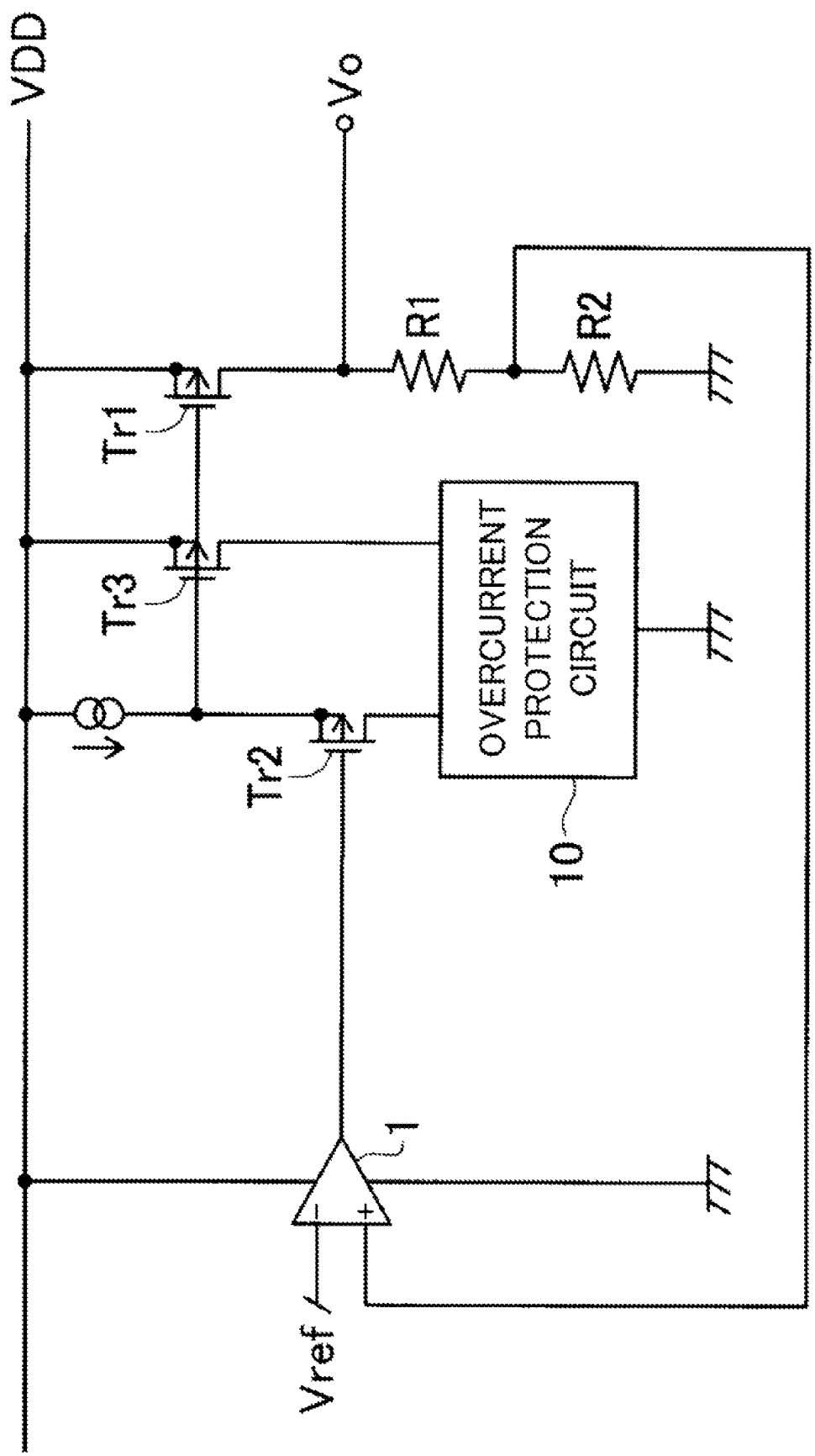
FIG. 2 illustrates a circuit diagram of a first embodiment.

FIG. 2 illustrates a circuit diagram of a first embodiment. In FIG. 2, the same reference numerals are applied to constituent components corresponding to those of FIG. 1. An overcurrent protection circuit 10 is coupled to the drain of the current detection transistor Tr3 and the drain of the buffer transistor Tr2. In other aspects, the configuration is similar to that of FIG. 1, and hence an explanation thereof is omitted.

In this configuration, the output overcurrent of the output transistor Tr1 is monitored with the drain current of the current detection transistor Tr3. The overcurrent protection circuit 10 limits the drain current of the buffer transistor Tr2 based on an increase of the drain current of the current detection transistor Tr3. When the drain current of the buffer transistor Tr2 is limited and decreases, the gate voltage of the output transistor Tr1 rises. When the gate voltage of the output transistor Tr1 rises, the on-resistance of the output transistor Tr1 increases. That is, the gate voltage of the output transistor Tr1 is controlled so that the output voltage of the output transistor Tr1 lowers. As a result, the overcurrent protection works.

In this way, the drain current of the buffer transistor Tr2 is limited, and the output current of the output transistor Tr1 can be controlled. Consequently, it is possible to make the feedback path relatively short.

Figure 3:
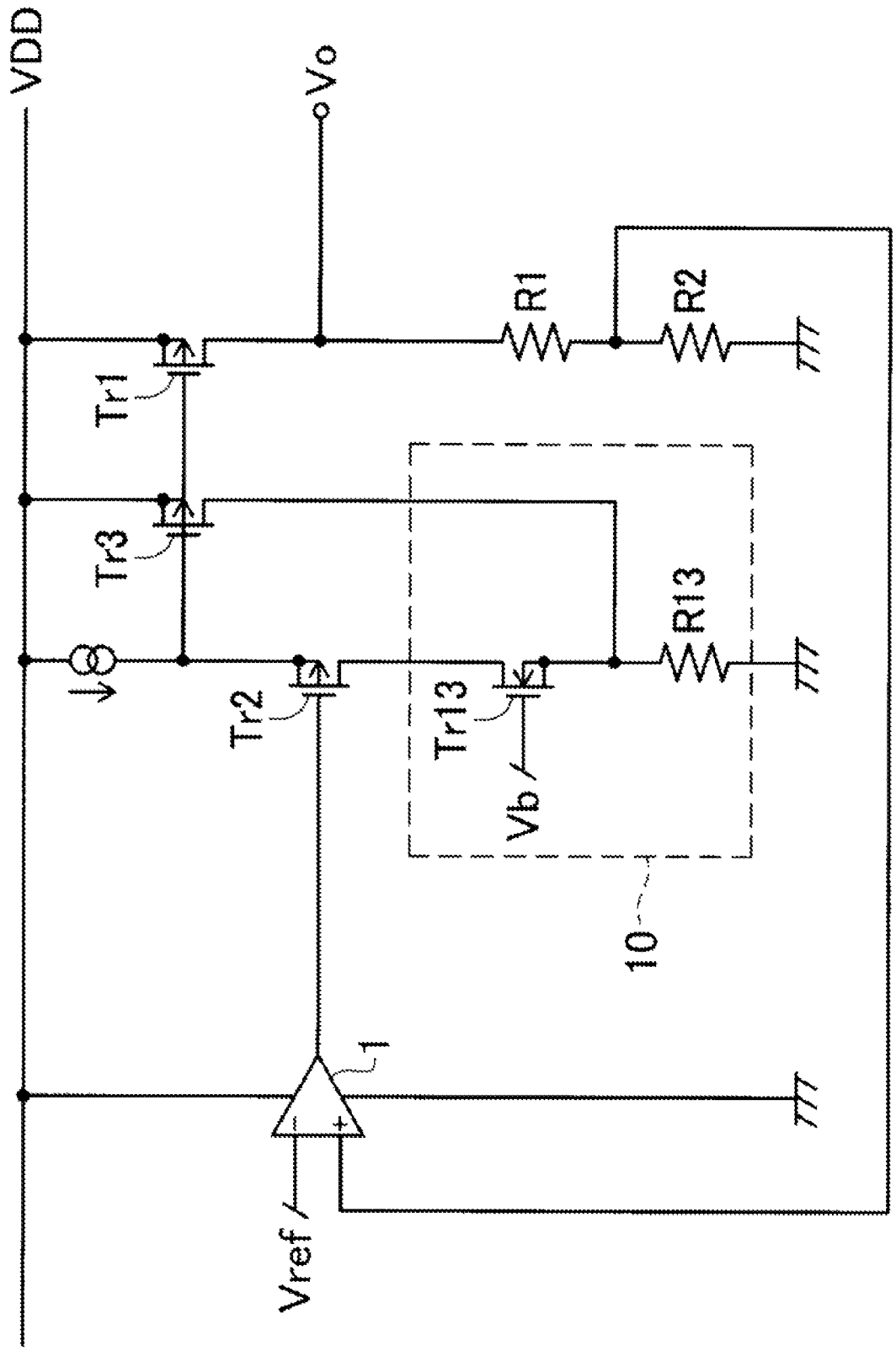
FIG. 3 illustrates a circuit diagram of a first illustrative example of the first embodiment.

FIG. 3 is a circuit diagram showing a first illustrative example of specific configuration of the overcurrent protection circuit 10 according to the first embodiment of FIG. 2. In the first illustrative example, as illustrated in FIG. 3, the overcurrent protection circuit 10 includes a resistor R13 and an N channel MOS transistor Tr13. The resistor R13 is provided between the drain of the current detection transistor Tr3 and the ground. The gate of the transistor Tr13 is biased to constant voltage Vb. The source of the transistor Tr13 is provided between the drain of the current detection transistor Tr3 and the resistor R13. The drain of the transistor Tr13 is coupled to the drain of the buffer transistor Tr2.

The operation of the first illustrative example having the above configuration will be described. As the output current of the output transistor Tr1 increases, the drain current flowing in the current detection transistor Tr3 sharing a gate and source with the output transistor Tr1 increases. When the drain current of the current detection transistor Tr3 increases, the current flowing in the resistor R13 increases. Thus, the source voltage of the transistor Tr13 rises. Since the gate of the transistor Tr13 is biased to constant voltage Vb, the gate-source voltage of the transistor Tr13 lowers and the on-resistance of the resistor R13 increases. Consequently, the drain current of the buffer transistor Tr2 is limited and decreases. Thus, the gate voltage of the output transistor Tr1 rises. As a result, as described with reference to FIG. 2, the overcurrent protection works.

The output overcurrent of the output transistor Tr1 is monitored with the drain current of the current detection transistor Tr3. The drain current of the buffer transistor Tr2 is limited by the overcurrent protection circuit 10 and the gate voltage of the output transistor Tr1 is controlled, whereby the overcurrent protection works. Consequently, it is possible to make the feedback path relatively short; and the response in overcurrent protection is improved, and the stability of circuit operation is improved.

Figure 4:
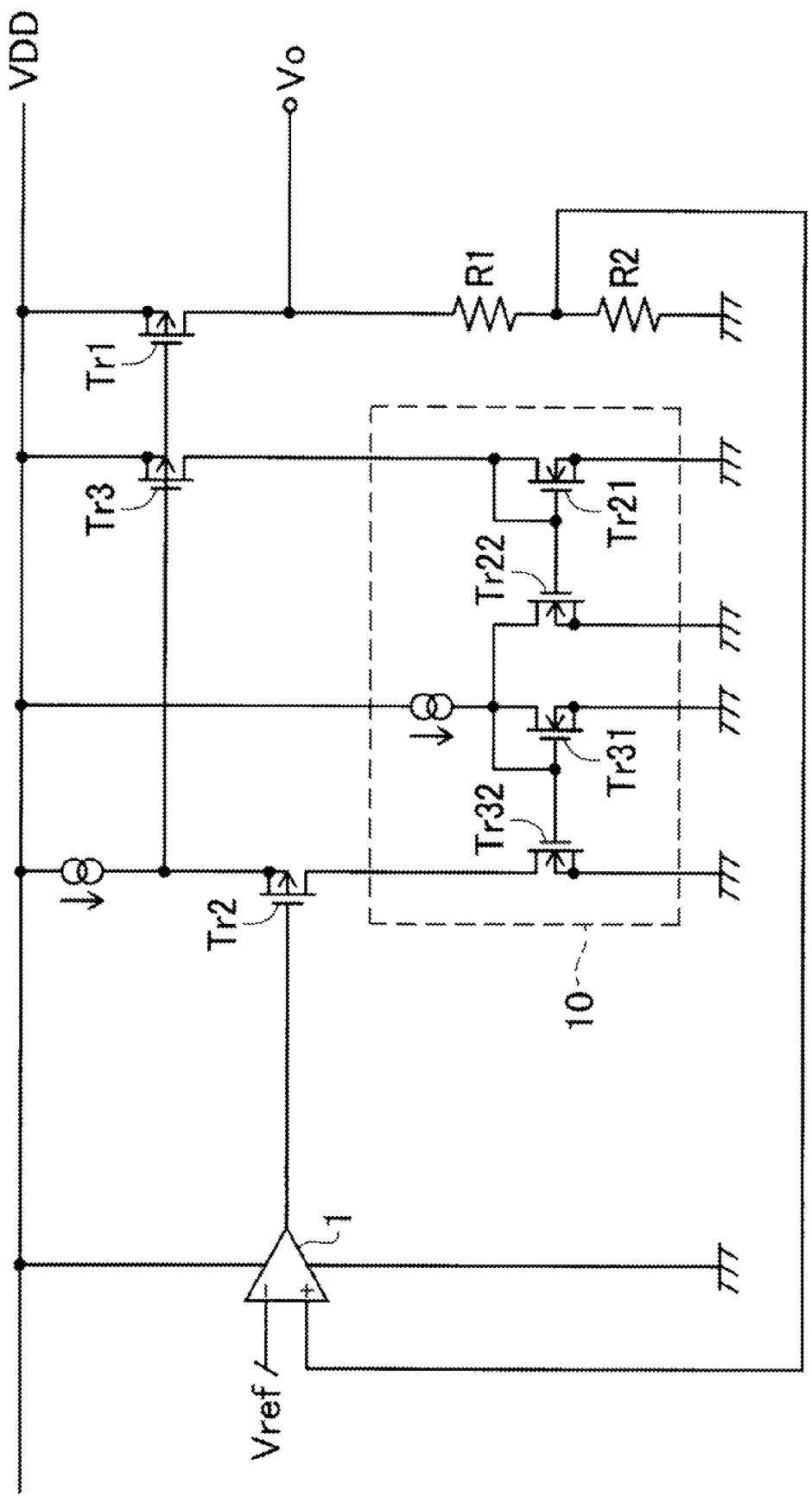
FIG. 4 illustrates a circuit diagram of a second illustrative example of the first embodiment.

FIG. 4 is a circuit diagram showing a second illustrative example of a specific configuration of the overcurrent protection circuit 10 according to the first embodiment of FIG. 2. In the second illustrative example, as illustrated in FIG. 4, the overcurrent protection circuit 10 includes a current mirror circuit composed of N channel MOS transistors Tr21 and Tr22 at the input side. Further, the overcurrent protection circuit 10 includes a current mirror circuit composed of N channel MOS transistors Tr31 and Tr32 at the output side. An input terminal of the input-side current mirror circuit is coupled to the drain of the current detection transistor Tr3. An output terminal of the output-side current mirror circuit is coupled to the drain of the buffer transistor Tr2. An output terminal of the input-side current mirror circuit and an input terminal of the output-side current mirror circuit are coupled to each other and at the same time coupled via a constant current source to power supply voltage VDD.

An operation of the second illustrative example having the above configuration will be described. As the output current of the output transistor Tr1 increases, the drain current flowing in the current detection transistor Tr3 sharing a gate and source with the output transistor Tr1 increases. When the drain current of the current detection transistor Tr3 increases, the transistors Tr21 and Tr22 of the input-side current mirror circuit operate in a current mirror mode, and the current flowing in the transistor Tr22 increases. Since constant current is supplied from the constant current source, when the current flowing in the transistor Tr22 increases, the current flowing in the transistor Tr31 decreases. In the output-side current mirror circuit, the transistors Tr31 and Tr32 operate in a current mirror mode, and the current flowing in the transistor Tr32 decreases. Consequently, the drain current of the buffer transistor Tr2 decreases, so that the gate voltage of the output transistor Tr1 rises. As a result, as described with reference to FIG. 2, the overcurrent protection works.

In the second illustrative example illustrated in FIG. 4, as with the first illustrative example illustrated in FIG. 3, the output overcurrent of the output transistor Tr1 is monitored with the drain current of the current detection transistor Tr3. The overcurrent protection circuit 10 limits the drain current of the buffer transistor Tr2 and thereby controls the gate voltage of the output transistor Tr1. Consequently, it is possible to make the feedback path relatively short; and the response in overcurrent protection is improved, and the stability of circuit operation is improved.

In the second illustrative example illustrated in FIG. 4, the overcurrent protection circuit 10 requires no resistance element as a constituent component. A resistance element occupies a large area, compared to transistors. Thus, for the second illustrative example using no resistance element, the size of the circuit can be reduced. Further, when the characteristics of the transistors included in the current mirror circuit are made identical to each other, variations in circuit operation can be reduced.

Figure 5:
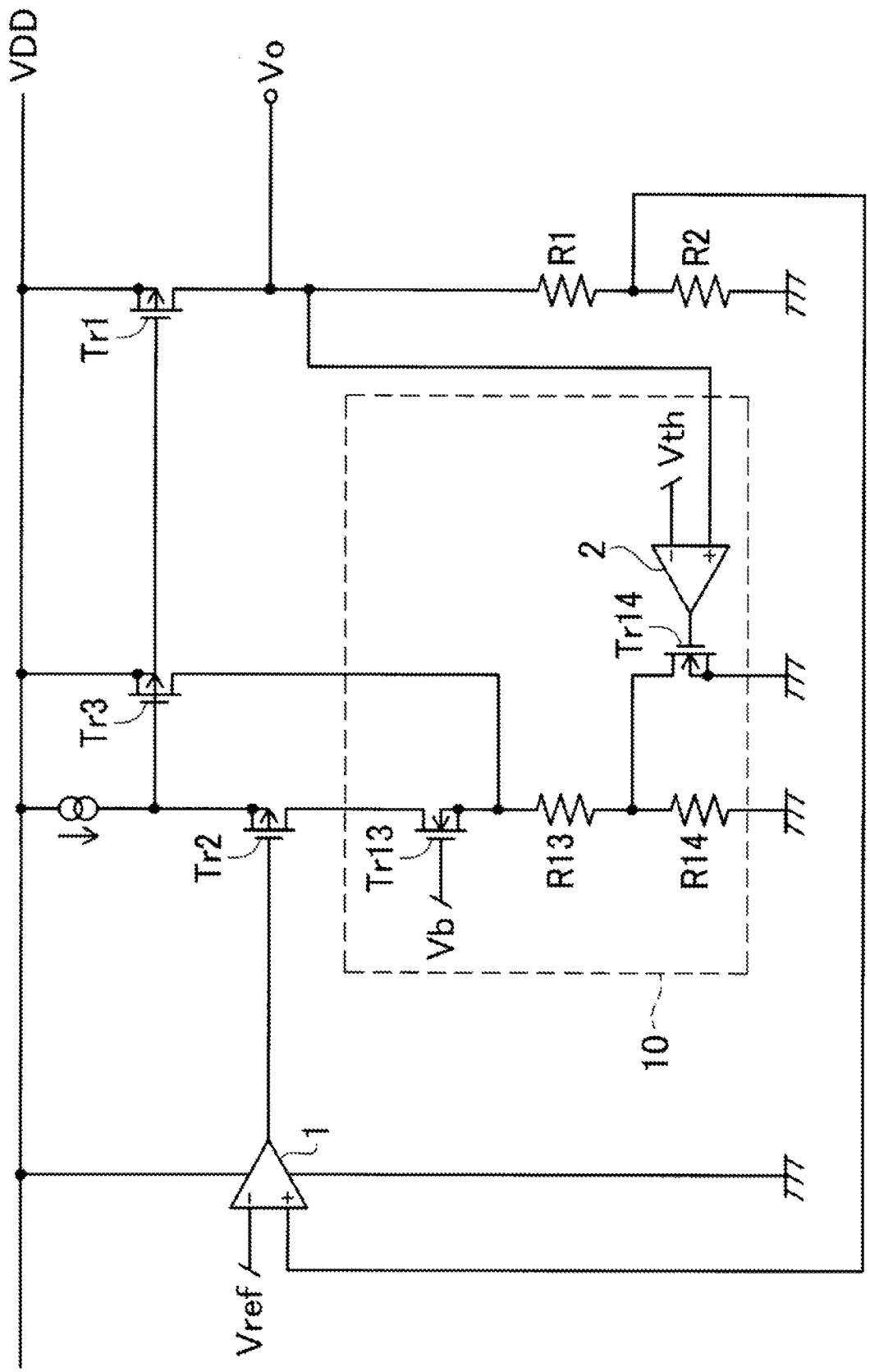
FIG. 5 illustrates a circuit diagram of a third illustrative example of the first embodiment.

FIG. 5 is a circuit diagram showing a third illustrative example of a specific configuration of the overcurrent protection circuit 10 according to the first embodiment of FIG. 2. In the third illustrative example illustrated in FIG. 5, Short Circuit Protection (hereinafter referred to as an SCP) is added to the first illustrative example illustrated in FIG. 3. In the third illustrative example, as illustrated in FIG. 5, the overcurrent protection circuit 10 includes a resistor R14, an error amplifier 2, and an N channel MOS transistor Tr14 in addition to the resistor R13 and the transistor Tr13. The resistor R14 is coupled in series to the ground side of the resistor R13. Output voltage Vo is inputted to a plus-side input terminal of the error amplifier 2. A certain voltage Vth is inputted to a minus-side input terminal of the error amplifier 2. The output of the error amplifier 2 is inputted to a gate of the transistor Tr14. A drain of the transistor Tr14 is provided between the resistors R13 and R14. A source of the transistor Tr14 is coupled to the ground. In other aspects, the configuration is similar to that of FIG. 3, and hence an explanation thereof is omitted.

Figure 6:
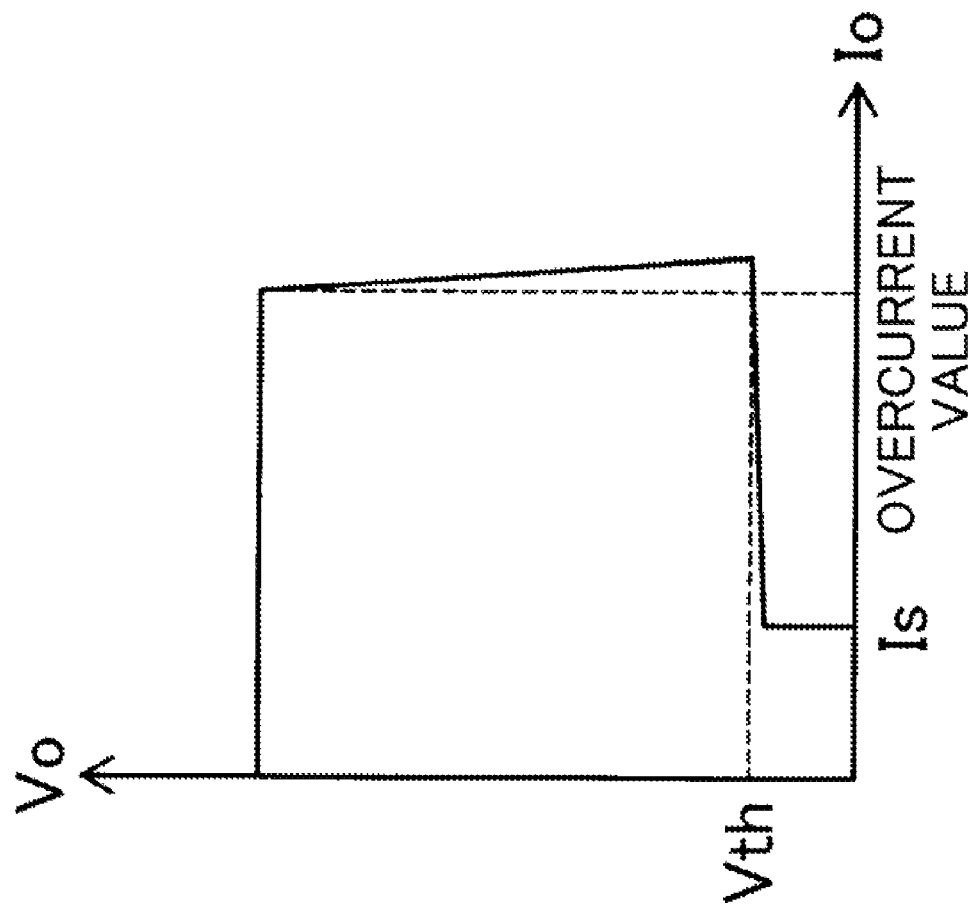
FIG. 6 illustrates an output characteristic in the third illustrative example of the first embodiment.

The operation of the third illustrative example having the above configuration will be described with reference to FIG. 6. FIG. 6 is a view illustrating an output characteristic in the third illustrative example illustrated in FIG. 5. As already described, the error amplifier 1 drives the output transistor Tr1 via the buffer transistor Tr2 so that output voltage Vo is kept constant. Accordingly, the power supply circuit keeps constant output voltage Vo to be supplied to a load.

In the ordinary operation, output voltage Vo is kept constant at a value higher than a certain voltage Vth, so that the output of the error amplifier 2 turns on the transistor Tr14. Consequently, current flowing in the resistor R13 does not flow into the resistor R14, but flows via the transistor Tr14 to the ground. Accordingly, the circuit of the third illustrative example illustrated in FIG. 5 substantially operates similarly to the circuit of the first illustrative example illustrated in FIG. 3. When output current Io of the output transistor Tr1 increases and reaches an overcurrent value, the overcurrent protection works as described with reference to FIG. 3, so that output voltage Vo begins to decrease.

When output voltage Vo falls below a certain voltage Vth, the output of the error amplifier 2 turns off the transistor Tr14. Consequently, the current flowing in the resistor R13 begins to flow to the resistor R14. Accordingly, even when output current Io has a short-circuit current value Is that is smaller than the overcurrent value, the overcurrent protection works. Thus, the output characteristic illustrated in FIG. 6 may be achieved.

Here, the correspondence relationship with the claims is as follows: the error amplifier 1 is an example of a first error amplifier; the resistor R13 is an example of a first resistor; the transistor Tr13 is an example of a first transistor; the input-side current mirror circuit composed of the N channel MOS transistors Tr21 and Tr22 is an example of a first current mirror circuit; the output-side current mirror circuit composed of the N channel MOS transistors Tr31 and Tr32 is an example of a second current mirror circuit; the resistor R14 is an example of a second resistor; the error amplifier 2 is an example of a second error amplifier; the transistor Tr14 is an example of a second transistor.

As described in detail above, according to the present embodiment, in the power supply circuit that outputs a constant voltage, output overcurrent is monitored by the current detection transistor Tr3 which is coupled to the output transistor Tr1 such that the gate and source are shared. The overcurrent protection circuit 10 limits the drain current of the buffer transistor Tr2 based on the increase of the drain current of the current detection transistor Tr3 and thereby controls the output current of the output transistor Tr1.

Consequently, it is possible to make the feedback path relatively short; and the response in overcurrent protection is improved, and the stability of circuit operation is improved. Since the feedback path is shortened, circuit oscillation seldom occurs and the variations in circuit operation are reduced.

It is to be understood that the invention is not limited to the embodiment described above, and many changes or modifications to the embodiment are possible without departing from the spirit of the invention.

For example, in the third illustrative example illustrated in FIG. 5, a resistor R14, an error amplifier 2, and an N channel MOS transistor Tr14 make up an SCP. However, it will easily be appreciated that the invention is not limited thereto. Any circuit that can suppress short-circuit current may be used. Further, an electronic circuit may be constructed by coupling a load circuit to the output terminal of the power supply circuit according to the present invention. In this case, the response in overcurrent protection for output current supplied to the load circuit is improved, so it is possible to prevent damages to the electronic circuit caused by overcurrent.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions have been described in detail, it should be understood that the various changes, substitutions, and alterations could be made hereto without departing from the spirit and scope of the invention.

What is claimed is:

1. A power supply circuit comprising:
    an output transistor including a source coupled to a power supply voltage, and a drain from which output voltage is outputted;
    a first error amplifier, powered by the power supply voltage, and outputting a signal based on a potential difference between the output voltage and a reference voltage;
    a buffer transistor including a gate coupled to the output of the first error amplifier, and a source coupled via a constant current source to the power supply voltage and coupled to a gate of the output transistor;
    a current detection transistor coupled to the output transistor such that a gate and source are shared; and
    an overcurrent protection circuit configured to limit the drain current of the buffer transistor based on the increase of the drain current of the current detection transistor and thereby control the output current of the output transistor.

2. The power supply circuit according to claim 1, wherein the overcurrent protection circuit includes:
    a first resistor coupled to a drain of the current detection transistor; and
    a first transistor including a gate that is biased to a constant voltage, a source provided between the drain of the current detection transistor and the first resistor, and a drain coupled to a drain of the buffer transistor.

3. The power supply circuit according to claim 1, wherein:
    the overcurrent protection circuit includes a first current mirror circuit including an input terminal coupled to the drain of the current detection transistor, and a second current mirror circuit including an output terminal coupled to the drain of the buffer transistor; and
    an output terminal of the first current mirror circuit and an input terminal of the second current mirror circuit are coupled to each other and coupled via a constant current source to the power supply voltage.

4. The power supply circuit according to claim 2, wherein the overcurrent protection circuit further includes:
    a second resistor coupled in series to the first resistor;

a second error amplifier that outputs a voltage based on a potential difference between the output voltage and a certain voltage; and a second transistor including a gate coupled to the output of the second error amplifier, and a drain provided between the first resistor and the second resistor.

5. An overcurrent protection circuit for a power supply circuit, comprising:

an output transistor including a source coupled to power supply voltage, and a drain from which output voltage is outputted; a first error amplifier, powered by the power supply voltage, and outputting a signal based on a potential difference between the output voltage and a reference voltage; and a buffer transistor including a gate coupled to the output of the first error amplifier, and a source coupled via a constant current source to the power supply voltage and at the same time coupled to a gate of the output transistor, wherein:

there is included a current detection transistor coupled to the output transistor such that the gate and source are shared; and the first error amplifier drives the output transistor via the buffer transistor so that the output voltage is kept constant, and limits the drain current of the buffer transistor based on the increase of the drain current of the current detection transistor and thereby controls the output current of the output transistor.

6. The overcurrent protection circuit according to claim 5, further comprising:

a first resistor coupled to a drain of the current detection transistor; and a first transistor including a gate that is biased to a constant voltage, a source provided between the drain of the current detection transistor and the first resistor, and a drain coupled to a drain of the buffer transistor.

7. The overcurrent protection circuit according to claim 5, further comprising:

a first current mirror circuit including an input terminal coupled to the drain of the current detection transistor; and a second current mirror circuit including an output terminal coupled to the drain of the buffer transistor, wherein an output terminal of the first current mirror circuit and an input terminal of the second current mirror circuit are coupled to each other and at the same time coupled via a constant current source to the power supply voltage.

8. The overcurrent protection circuit according to claim 6, further comprising:

a second resistor coupled in series to the first resistor;

a second error amplifier that outputs a voltage based on a potential difference between the output voltage and a certain voltage; and a second transistor including a gate coupled to the output of the second error amplifier, and a drain provided between the first resistor and the second resistor.

9. An electronic device comprising:

a power supply circuit that includes an output transistor including a source coupled to power supply voltage, and a drain from which output voltage is outputted; a first error amplifier, powered by the power supply voltage, and outputting a signal based on a potential difference between the output voltage and a reference voltage; and a buffer transistor including a gate coupled to the output of the first error amplifier, and a source coupled via a constant current source to the power supply voltage and at the same time coupled to a gate of the output transistor;

a load circuit coupled to an output terminal of the power supply circuit; and an overcurrent protection circuit that includes a current detection transistor coupled to the output transistor such that a gate and source are shared; and limits the drain current of the buffer transistor based on the increase of the drain current of the current detection transistor and thereby controls output current supplied to the load circuit.

* * * * *